US006569697B2

(12) United States Patent
Lu et al.

(10) Patent No.: US 6,569,697 B2
(45) Date of Patent: May 27, 2003

(54) METHOD OF FABRICATING ELECTRODES

(75) Inventors: Min-Hao Michael Lu, Lawrenceville, NJ (US); Michael S. Weaver, Princeton, NJ (US); Michael Hack, Pennington, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 09/931,939

(22) Filed: Aug. 20, 2001

(65) Prior Publication Data

US 2003/0044587 A1 Mar. 6, 2003

(51) Int. Cl.$^7$ ............................................. H01L 51/140
(52) U.S. Cl. .................................. 438/22; 33/99; 33/46
(58) Field of Search .............................. 428/690, 691, 428/917; 313/501–506; 438/22, 24, 33, 99, 57; 257/448; 427/539, 569, 402, 255.7, 102; 345/169.3

(56) References Cited

U.S. PATENT DOCUMENTS

| 5,703,436 A | 12/1997 | Forrest et al. |
| 5,707,745 A | 1/1998 | Forrest et al. |
| 5,714,838 A | 2/1998 | Haight et al. |

(List continued on next page.)

FOREIGN PATENT DOCUMENTS

| EP | 0 856 896 | 8/1998 |
| JP | 8-185984 | 7/1996 |
| JP | 2001-43980 | 2/2001 |
| WO | 00/65879 | 11/2000 |
| WO | 01/57904 | 8/2001 |

OTHER PUBLICATIONS

V. Bulovic et al., "Transparent light–emitting devices", *Nature*, vol. 380, p. 29, Mar. 7, 1996.
G. Gu, et al., "Transparent organic light emitting devices", *Appl. Phys. Lett*, vol. 68, No. 19, pp. 2606–2608, May 6, 1996.

(List continued on next page.)

*Primary Examiner*—Savitri Mulpuri
(74) *Attorney, Agent, or Firm*—Kenyon & Kenyon

(57) ABSTRACT

A method of fabricating a device is provided. A substrate having first conductive layer disposed thereon. An organic layer is fabricated over the first conductive layer. A second conductive layer is then fabricated over the organic layer such that the second conductive layer is in electrical contact with the first conductive layer during at least a portion of the step of depositing the second conductive layer. The electrical contact between the first conductive layer and the second conductive layer is then broken. A method of fabricating an active matrix array of organic light emitting devices is also provided. A substrate is obtained, having circuitry adapted to control the current flowing through each organic light emitting device, and having a first conductive layer disposed thereon, such that the first conductive layer is electrically attached to the circuitry. An organic layer is fabricated over the first conductive layer. A second conductive layer is then fabricated over the organic layer such that the second conductive layer is in electrical contact with the circuitry, and such that the circuitry allows sufficient leakage between the first conductive layer and the second conductive layer to reduce the electrical field across the organic layer, during at least a portion of the step of fabricating the second conductive layer. The electrical contact between the circuitry and the second conductive layer is then broken.

33 Claims, 11 Drawing Sheets

U.S. PATENT DOCUMENTS

| | | | |
|---|---|---|---|
| 5,739,545 | A | 4/1998 | Guha et al. |
| 5,739,635 | A | 4/1998 | Wakimoto |
| 6,069,442 | A | 5/2000 | Hung et al. |

OTHER PUBLICATIONS

V. Bulovic et al., "A surface–emitting vacuum–deposited organic light emitting device", *Appl. Phys. Lett*, vol. 70, No. 22, pp. 2954–2956, Jun. 2, 1997.

G. Parthasarathy et al., "A metal–free cathode for organic semiconductor devices", *Appl. Phys. Lett*, vol. 72, No. 17, pp. 2138–2140, Apr. 27, 1998.

L.S. Hung et al., "Interface engineering in preparation of organic surface–emitting diodes", *Appl. Phys. Lett.*, vol. 74, No. 21, pp. 3209–3211, May 24, 1999.

P.E. Burrows et al., "Semitransparent cathodes for organic light emitting devices", *Journal of Applied Physics*, vol. 87, No. 6, pp. 3080–3085, Mar. 15, 2000.

G. Parthasarathy, et al., "High–efficiency transparent organic light–emitting devices", *Appl. Phys. Lett.*, vol. 76, No. 15, pp. 2128–2130, Apr. 10, 2000.

L.S. Hung et al., "Application of an ultrathin LiF/Al bilayer in organic surface–emitting diodes", *Appl. Phys. Lett.*, vol. 78, No. 4, pp. 544–546, Jan. 22, 2001.

A. Yamamori, et al., "Transparent organic light–emitting diodes using metal acethylacetonate complexes as an electron injective buffer layer", *Appl. Phys. Lett.*, vol. 78, No. 21, pp. 3343–3345, May 21, 2001.

L.S. Hung et al., "Sputter deposition of cathodes in organic light emitting diodes", *Journal of Applied Physics*, vol. 86, No. 8, pp. 4607–4612, Oct. 15, 1999.

P.K. Raychaudhuri, et al., "Fabrication of Lithium–Based Alloy Cathodes for Organic Light–Emitting Diodes by D C Magnetron Sputtering", SID 01 Digest, pp. 526–529, 2001.

L.S. Hung et al., "Voltage reduction in organic light–emitting diodes", vol. 78, No. 23, pp. 3732–3734, Jun. 4, 2001.

Parthasarathy et al., U.S. patent Application Ser. No. 09/054,707, "Highly Transparent Non–Metallic Cathodes", filed Apr. 3, 1998.

METHOD OF FABRICATING ELECTRODES

The subject matter of this application is related to concurrently filed patent application Ser. No. 09/931,948 which is incorporated by reference in its entirety.

FIELD OF THE INVENTION

The present invention relates to the field of organic semiconductor devices, and more particularly to transparent electrodes used in such devices.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials have performance advantages over conventional materials. For example, the wavelength at which an organic emissive layer emits light may generally be readily tuned with appropriate dopants, while it may be more difficult to tune inorganic emissive materials. As used herein, the term "organic material" includes polymers as wells as small molecule organic materials that may be used to fabricate organic opto-electronic devices.

OLEDs makes use of thin organic films that emit light when voltage is applied across the device. OLEDs are becoming an increasingly popular technology for applications such as flat panel displays, illumination, and backlighting. OLED configurations include double heterostructure, single heterostructure, and single layer, and a wide variety of organic materials may be used to fabricate OLEDs. Several OLED materials and configurations are described in U.S. Pat. No. 5,707,745, which is incorporated herein by reference in its entirety.

One or more transparent electrodes may be useful in an organic opto-electronic device. For example, OLED devices are generally intended to emit light through at least one of the electrodes. For OLEDs from which the light emission is only out of the bottom of the device, that is, only through the substrate side of the device, a transparent anode material, such as indium tin oxide (ITO), may be used as the bottom electrode. Since the top electrode of such a device does not need to be transparent, such a top electrode, which is typically a cathode, may be comprised of a thick and reflective metal layer having a high electrical conductivity. In contrast, for transparent or top-emitting OLEDs, a transparent cathode such as disclosed in U.S. Pat. Nos. 5,703,436 and 5,707,745 may be used. As distinct from a bottom-emitting OLED, a top-emitting OLED is one which may have an opaque and/or reflective substrate, such that light is produced only out of the top of the device and not through the substrate. In addition, a fully transparent OLED that may emit from both the top and the bottom.

The transparent cathodes as disclosed in U.S. Pat. Nos. 5,703,436 and 5,707,745 typically comprise a thin layer of metal such as Mg:Ag with a thickness, for example, that is less than about 100 angstroms. The Mg:Ag layer is coated with a transparent, electrically-conductive, sputter-deposited, ITO layer. Such cathodes may be referred to as compound cathodes or as TOLED ("Transparent-OLED") cathodes. The thickness of the Mg:Ag and ITO layers in such compound cathodes may each be adjusted to produce the desired combination of both high optical transmission and high electrical conductivity.

The organic materials of an opto-electronic device may be very sensitive, and may be damaged by conventional semiconductor processing. For example, any exposure to high temperature or chemical processing may damage the organic layers and adversely affect device reliability. In addition, exposure to air or moisture may also damage the sensitive organic layers. Such exposure may also damage any Mg:Ag layer that may be present, because Mg:Ag is highly reactive. The organic materials may also be damaged by the processes used to deposit transparent electrode materials. While conventional processes and structures allow for the fabrication of operational organic devices with transparent electrodes, the yield with such processes may be less than optimal. Indeed, the yield may not be great enough to fabricate commercially viable displays, for example, where the failure of only a few percent of the devices may render the display unsuitable for commercial use. There is therefore a need for a method of fabrication and/or transparent electrode structures that result in higher yields.

SUMMARY OF THE INVENTION

A cathode adapted for use in an organic optoelectronic device is provided. The cathode has an electron injection layer, an organic buffer layer, a conducting layer, and a transparent conductive oxide layer disposed, in that order, over the organic operative layers of the optoelectronic device. A method of fabricating the cathode is also provided.

A method of fabricating a device is provided. A substrate having first conductive layer disposed thereon. An organic layer is fabricated over the first conductive layer. A second conductive layer is then fabricated over the organic layer such that the second conductive layer is in electrical contact with the first conductive layer during at least a portion of the step of depositing the second conductive layer. The electrical contact between the first conductive layer and the second conductive layer is then broken.

A method of fabricating an active matrix array of organic light emitting devices is provided. A substrate is obtained, having circuitry adapted to control the current flowing through each organic light emitting device, and having a first conductive layer disposed thereon, such that the first conductive layer is electrically attached to the circuitry. An organic layer is fabricated over the first conductive layer. A second conductive layer is then fabricated over the organic layer such that the second conductive layer is in electrical contact with the circuitry, and such that the circuitry allows sufficient leakage between the first conductive layer and the second conductive layer to reduce the electrical field across the organic layer, during at least a portion of the step of fabricating the second conductive layer. The electrical contact between the circuitry and the second conductive layer is then broken.

DETAILED DESCRIPTION

In an embodiment of the invention, a multi-layer transparent cathode structure is provided. The structure includes a layer of conductive oxide, such as indium tin oxide (ITO), zinc indium tin oxide, or aluminum zinc oxide. The structure may also include an electron injection layer that enhances the injection of electrons from the cathode into the organic layers of the device. The structure may also include an organic buffer layer that protects underlying organic layers during the subsequent deposition of ITO. The structure may also include a conductive layer that enhances the injection of electrons from the ITO layer into other layers of the electrode.

Figure 1:
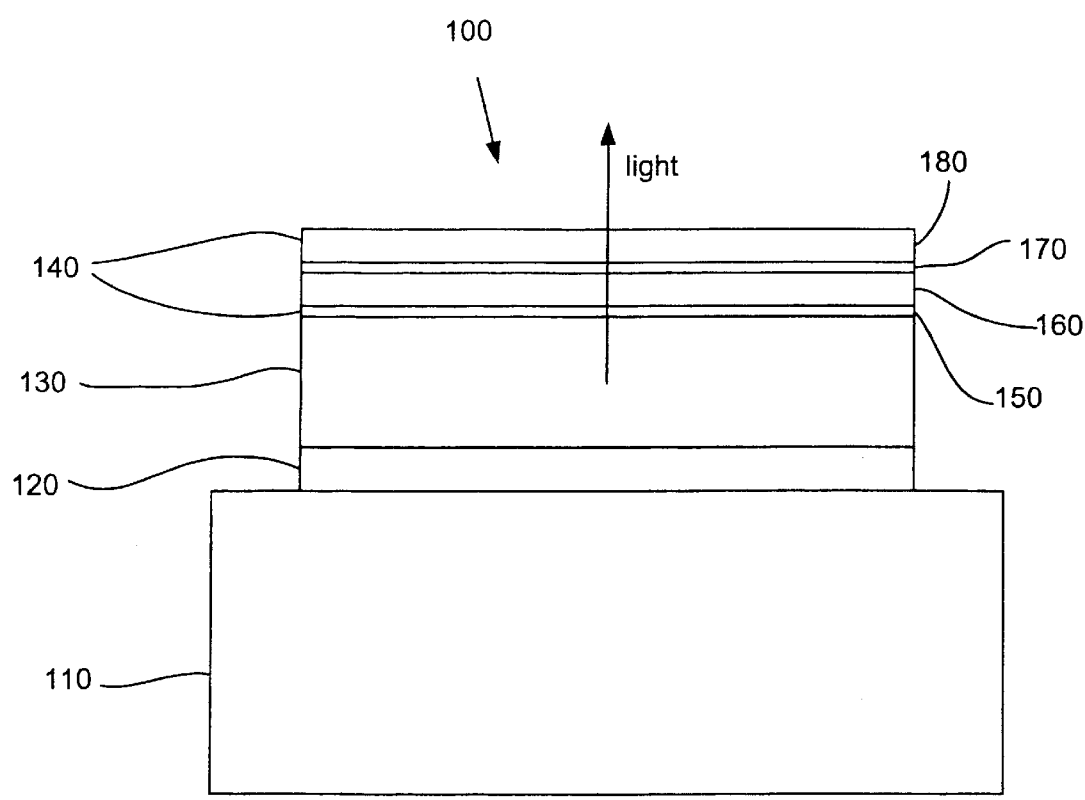
FIG. 1 shows a top-emitting organic light emitting device having a transparent multi-layer top electrode through which light may be emitted.

FIG. 1 shows a top-emitting organic light emitting device 100 having a transparent multi-layer top electrode 140 through which light may be emitted. Device 100 is disposed over substrate 110, and includes a bottom electrode 120, an organic operative layer 130, and a top electrode 140, deposited in that sequence over substrate 110. Top electrode 140 further includes an electron injection layer 150, an organic buffer layer 160, a conducting layer 170, and a transparent conductive oxide layer 180, deposited in that sequence over organic operative layer 130.

Substrate 110 may be made of any conventional substrate material. Glass, plastic, metal foil, and ceramic substrates are known to the art. Substrate 110 may be rigid or flexible. Substrate 110 may be transparent or opaque. Substrate 110 may be a semiconductor such as silicon, which may facilitate the fabrication of circuitry connected to device 100 onn substrate 110.

Bottom electrode 120 may be made of any conventional electrode material. In the embodiment of FIG. 1, bottom electrode 120 is an anode. Indium tin oxide (ITO) and metal anodes are known to the art. Bottom electrode 120 may be transparent or opaque.

Organic operative layer 130 may be any organic layer known to the art that may be incorporated into an optoelectronic device between the electrodes of that device. In one embodiment, device 100 is an OLED, and operative organic layer 130 may include any conventional OLED organic materials. The word "operative" is intended to distinguish organic operative layer 130, i.e., the organic layer between the electrodes of an optoelectronic device, from any organic layer that may be a part of the cathode, such as organic buffer layer 160, but is not intended to otherwise limit the layer. Organic operative layer 130 may be a single layer, or may include the multiple layers of conventional OLED structures, such as a single or double heterostructure, or one or more layers containing a mixture of OLED organic materials. In other embodiments, organic operative layer 120 may be the one or more organic layers of a photodetector, photovoltaic cell, phototransistor, or other opto-electronic device.

Top electrode 140 further includes an electron injection layer 150, an organic buffer layer 160, a conducting layer 170, and a transparent conductive oxide layer 180, deposited in that sequence over organic operative layer 130. In one embodiment, it is contemplated that top electrode 140 may also include other layers. In such an embodiment, each layer may be described as "disposed over" an underlying layer. For example, organic buffer layer 160 may be described as "disposed over" electron injection layer 150 to allow for the possibility that there is one or more additional layers deposited between organic buffer layer 160 and electron injection layer 150. In another embodiment, it is contemplated that there are no layers other than those described, in which case the layers may be described as "disposed over and in physical contact with" the underlying layer. However, even in this embodiment it is contemplated that interfacial effects may occur between the layers described.

Electron injection layer 150 may improve the injection of electrons from organic buffer layer 160 into organic operative layer 130. A preferred electron injection layer 150 further comprising two layers, a layer of LiF disposed over organic operative layer 130, and a layer of Al disposed over the layer of LiF. Another preferred electron injection layer material is LiF co-evaporated with Al. Other preferred electron injection layer materials include $Li_2O$, CsF, alkali metal halides, and alkaline earth metal halides. The electron injection layer thickness is preferably as thin as possible, while still retaining electron injection capabilities. For example, the thickness is preferably about 5–25 Å, and more preferably about 25 Å. At these thicknesses, it is possible that the layers are not contiguous, and may form islands. It is also possible that much of the material, for example LiF, may dissociate and that the resultant Li may diffuse into other layers, such as organic buffer layer 160. Even if the layers are not contiguous and if there is significant dissociation and diffusion, the term "layer" is intended to describe the result of depositing the electron injection material.

Organic buffer layer 160 may reduce damage to underlying organic operative layer 130 during the fabrication of subsequently deposited layers. In particular, the processes used to deposit transparent conductive oxide layer 180 may damage organic operative layer in the absence of a buffer layer. Preferably, organic buffer layer has a high electron mobility, such that it does not significantly increase the operating voltage of device 100. Preferably, the electron mobility of organic buffer layer 160 is higher than that of any electron transport layer that may be included in organic operative layer 130. Preferably, organic buffer layer 160 does not increase the operating voltage of device 100 more than about 25% relative to a similar device with no organic buffer layer. More preferably, this increase is not more than about 10%. Preferred materials for organic buffer layer 160 include copper phthalocyanine (CuPc), and 2,9-dimethyl-4,7-diphenyl-1,10-phenanthroline (BCP). Other preferred materials include various metal phthalocyanines, such as ZnPc, MgPc, and PbPc. The thickness of organic buffer layer 160 is preferably thick enough that there is little or no damage to organic operative layer 130 due to fabrication processes that occur after organic buffer layer 160 is deposited, yet not so thick as to significantly increase the operating voltage of device 100. Preferably, buffer layer 160 is about 50–500 Å thick, and more preferably about 400 Å thick. Buffer layer 160 may be doped to increase its conductivity. For example, a CuPc or BCP buffer layer 160 may be doped with Li.

Conductive layer 170 may improve electron injection from transparent conductive oxide layer 180 into organic buffer layer 160. The injection of electrons from some transparent conductive oxides, such as ITO, into some organic buffer layers, such as CuPc, may be less than optimal. Conductive layer 170 may improve such injection. Preferred materials for conductive layer 170 include Mg:Ag, other metals, Ca, and LiF/Al, and any materials described above as preferred materials for electron injection layer 150. Conductive layer 170 is preferably very thin, because very little thickness is needed to improve electron injection, and any additional thickness may reduce the transparency of device 100. Where Mg:Ag is used, the thickness may preferably be up to about 125 Å, and more preferably about 100 Å or less. Where Mg:Ag is used, the ratio of Mg to Ag is preferable about 10:1 to 30:1. Where LiF/Al is used, conductive layer 170 is preferably similar to the LiF/Al layer described above as a potential electron injection layer 150.

Transparent conductive oxide layer 180 may be responsible for most of the conductivity of electrode 140 in the plane parallel to substrate 110. The material and thickness of transparent conductive oxide layer 180 may be chosen to achieve a desired combination of conductivity and transparency. Preferred materials for transparent conductive oxide layer include ITO, zinc indium tin oxide, and aluminum zinc oxide. Preferably, transparent conductive oxide layer is about 100–2000 Å thick, and more preferably about 500–1000 Å thick.

The materials and thicknesses of each of the layers of top electrode 140 may be selected in combination to control the optical properties of top electrode 140. For example, the materials and thicknesses may be selected to obtain a desired transparency. For applications where a high transparency is desirable, a transparency of greater than about 90% may be obtained. For other applications, a lower transparency may be desirable, and such transparencies may also be readily achieved through selection of materials and thicknesses. For example, a transparency of about 30% may be satisfactory for certain applications, and an electrode having such a transparency is considered "transparent" for such applications. Other optical properties may also be controlled by material selection and dopants. For example, CuPc may act as a blue filter, reducing the amplitude of visible light in the red region. Various dopants may be added to the layers of top electrode 140 to modify their optical properties.

Top electrode 140 may be used as the cathode of a device 100 that emits light through top electrode 140, but not through bottom electrode 120 and substrate 110. In such a device, the materials and thicknesses of bottom electrode 120 and substrate 110 are preferably selected to maximize back reflection, for example, a thick, highly reflective metal layer. Top electrode 140 may also be used as the cathode of a device 100 that emits light through both top electrode 140 and bottom electrode 120. In such a device, the materials and thicknesses of all layers may be selected to achieve a desired level of transparency.

Figure 2:
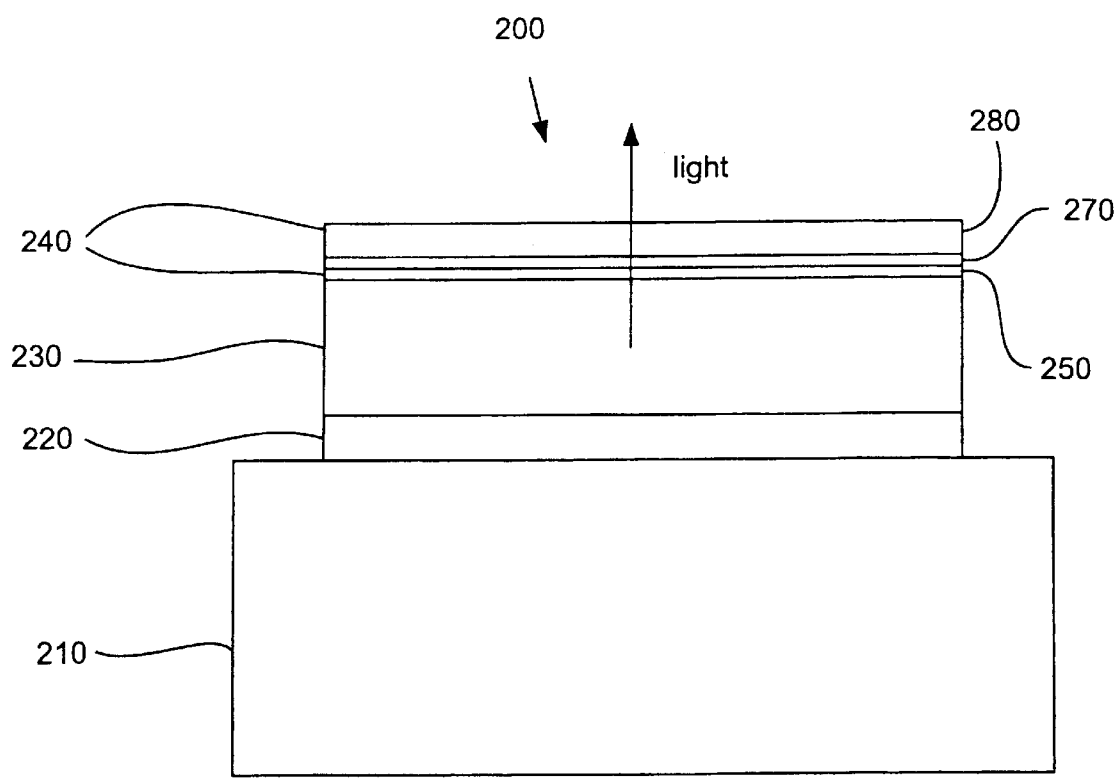
FIG. 2 shows a top-emitting organic light emitting device having a transparent multi-layer top electrode, having a structure different from that of FIG. 1, through which light may be emitted.

FIG. 2 shows a top-emitting organic light emitting device 200 having a transparent multi-layer top electrode 240 through which light may be emitted. Device 200 is disposed over substrate 210, and includes a bottom electrode 220, an organic operative layer 230, and a top electrode 240, deposited in that sequence over substrate 210. Top electrode 240 further includes an electron injection layer 250, a conducting layer 270, and a transparent conductive oxide layer 280, deposited in that sequence over organic operative layer 230.

The materials and thicknesses of substrate 210, bottom electrode 220, organic operative layer 230, electron injection layer 250, conducting layer 270, and transparent conductive oxide layer 280 of device 200 may be similar to those of substrate 110, bottom electrode 120, organic operative layer 130, electron injection layer 150, conducting layer 170, and transparent conductive oxide layer 180, respectively, of device 100.

The embodiment of FIG. 2 involves a trade-off when compared to that of FIG. 1. The absence of a buffer layer results in a simpler structure, with less manufacturing steps. However, the process used to deposit the conductive oxide layer, such as ITO, may be more restricted due to the absence of the protective buffer layer and the need to minimize damage to the operative organic layers. For example, a lower ITO deposition rate and different partial pressures of the various gases involved may be used in the embodiment of FIG. 2 as compared to the embodiment of FIG. 1.

Figure 3:
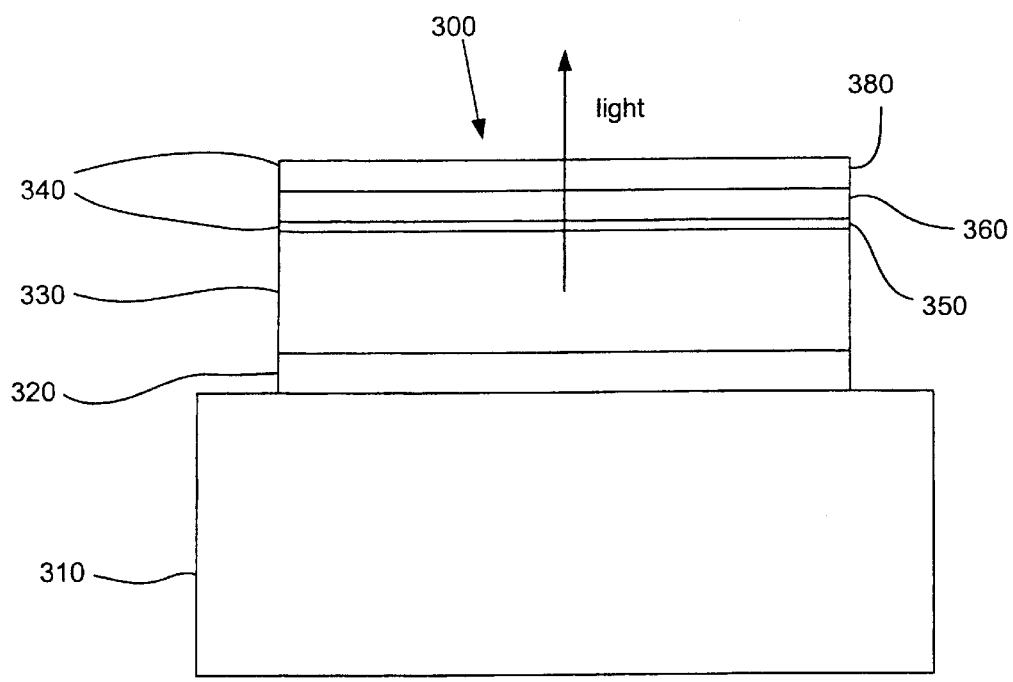
FIG. 3 shows a top-emitting organic light emitting device having a transparent multi-layer top electrode, having a structure different from that of FIGS. 1 and 2, through which light may be emitted.

FIG. 3 shows a top-emitting organic light emitting device 300 having a transparent multi-layer top electrode 340 through which light may be emitted. Device 300 is disposed over substrate 310, and includes a bottom electrode 320, an organic operative layer 330, and a top electrode 340, deposited in that sequence over substrate 310. Top electrode 340 further includes an electron injection layer 350, a buffer layer 360, and a transparent conductive oxide layer 380, deposited in.that sequence over organic operative layer 330.

The materials and thicknesses of substrate 310, bottom electrode 320, organic operative layer 330, electron injection layer 350, buffer layer 360, and transparent conductive oxide layer 380 of device 300 may be similar to those of substrate 110, bottom electrode 120, organic operative layer 130, electron injection layer 150, buffer layer 160, and transparent conductive oxide layer 180, respectively, of device 100.

The embodiment of FIG. 3 involves a trade-off when compared to that of FIG. 1. The absence of a conductive layer results in a simpler structure, with less manufacturing steps. Also, the absence of a conductive layer may result in an electrode having a higher transparency. However, while not intending to be limited as to any theory of how the invention works, it is believed that there is a difference between the embodiments of FIGS. 1 and 3 in the mechanism by which holes are injected from the conductive oxide into the buffer layer, which may result in a slightly higher operating voltage for the embodiment of FIG. 3. In particular, it is believed that the electron injection from the conductive oxide into the buffer layer in the embodiment of FIG. 3 is facilitated by damage states in the buffer layer. This mechanism is described in more detail in patent application Ser. No. 09/054,707, "Highly Transparent Non-Metallic Cathodes," which is incorporated by reference in its entirety. In addition, the cathode of FIG. 3 may be slightly less conductive than that of FIG. 1 in lateral directions, i.e., directions parallel to the substrate.

Top electrodes 140, 240 and 340 of FIGS. 1, 2 and 3 may advantageously be used as the cathode of an opto-electronic device, because of the electron injection layers included therein. By replacing the electron injection layer with an appropriate hole injection layer, the structures may advantageously be used as the anode of an opto-electronic device. Top electrodes 140 and 340 may advantageously be used as top electrodes, because of the buffer layer included therein. The structure of top electrode 240 may be advantageously used as a top electrode (cathode) or as a bottom electrode (cathode).

In addition, the organic materials of organic opto-electronic devices may sustain "charging damage" during fabrication. Charging damage is the result of a voltage applied across the device during fabrication, generally due to secondary electrons generated during the processes used to deposit electrodes after the organic layers are already present. Charging damage may occur during e-beam processes or plasma related processes, such as sputtering, plasma-enhanced chemical vapor deposition, and reactive ion etching. Unfortunately, many of the most desirable transparent electrode materials, such as indium tin oxide (ITO), are generally deposited using processes such as sputtering that generate secondary electrons. Again, conventional methods may be utilized to fabricate operational devices, but the yield may be less than optimal.

In an embodiment of the invention, a method of fabricating an opto-electronic device is provided that reduces charging damage. After a first electrode and an organic layer are fabricated, a second electrode is fabricated such that the second electrode is in electrical contact with the first electrode during at least a portion of the step of depositing the second electrode. This electrical contact may be through a direct conductive path, or it may be indirect, through circuitry that allows for enough leakage to reduce charging damage. Because the first and second electrode are in electrical contact during the fabrication of the second electrode, a significant voltage difference between the first and second electrodes is not sustainable, and charging damage is reduced. In order to create a functional device, the electrical contact between the first and second electrodes is broken after the second electrode is fabricated.

In one embodiment, the second electrode may be electrically connected to ground instead of to the first electrode during at least a portion of the step of depositing the second electrode. However, this embodiment is less preferable than electrically connecting the second electrode to the first electrode, because there may be a voltage difference between ground and the first electrode, which may have floating voltage. Even so, this embodiment may reduce the voltage difference between the first and second electrodes during fabrication of the second electrode. A connection to "ground" may be established, for example, by an electrical connection to a conductive wall of the chamber in which the device is being fabricated.

Figure 4:
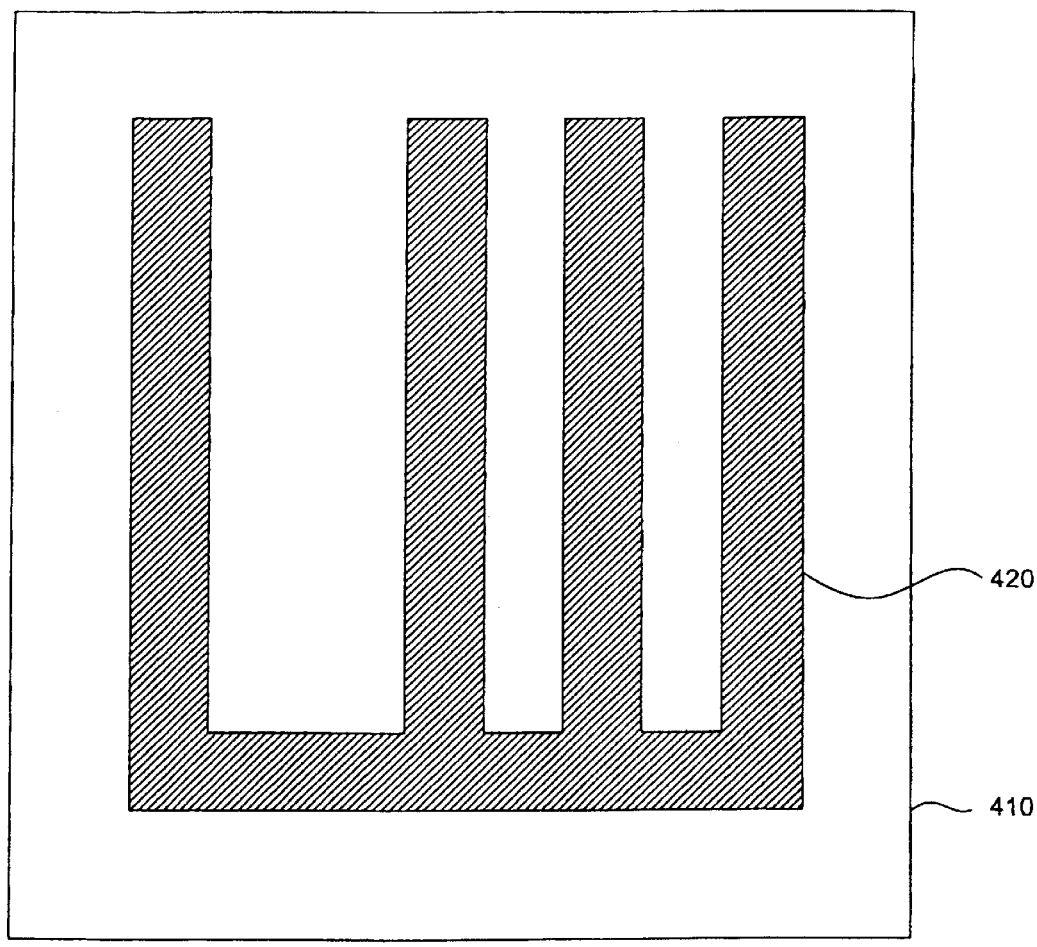
FIG. 4 shows a top view of a first patterned conductive layer disposed over a substrate.

FIG. 4 shows a first patterned conductive layer 420 disposed over a substrate 410. The particular pattern shown in FIG. 4 is designed for use in a passive matrix display. The materials and thicknesses of substrate 410 and first patterned conductive layer 420 may be any suitable substrate and electrode materials, respectively. Indium tin oxide (ITO) is a preferred material for first patterned conductive layer 420.

Figure 5:
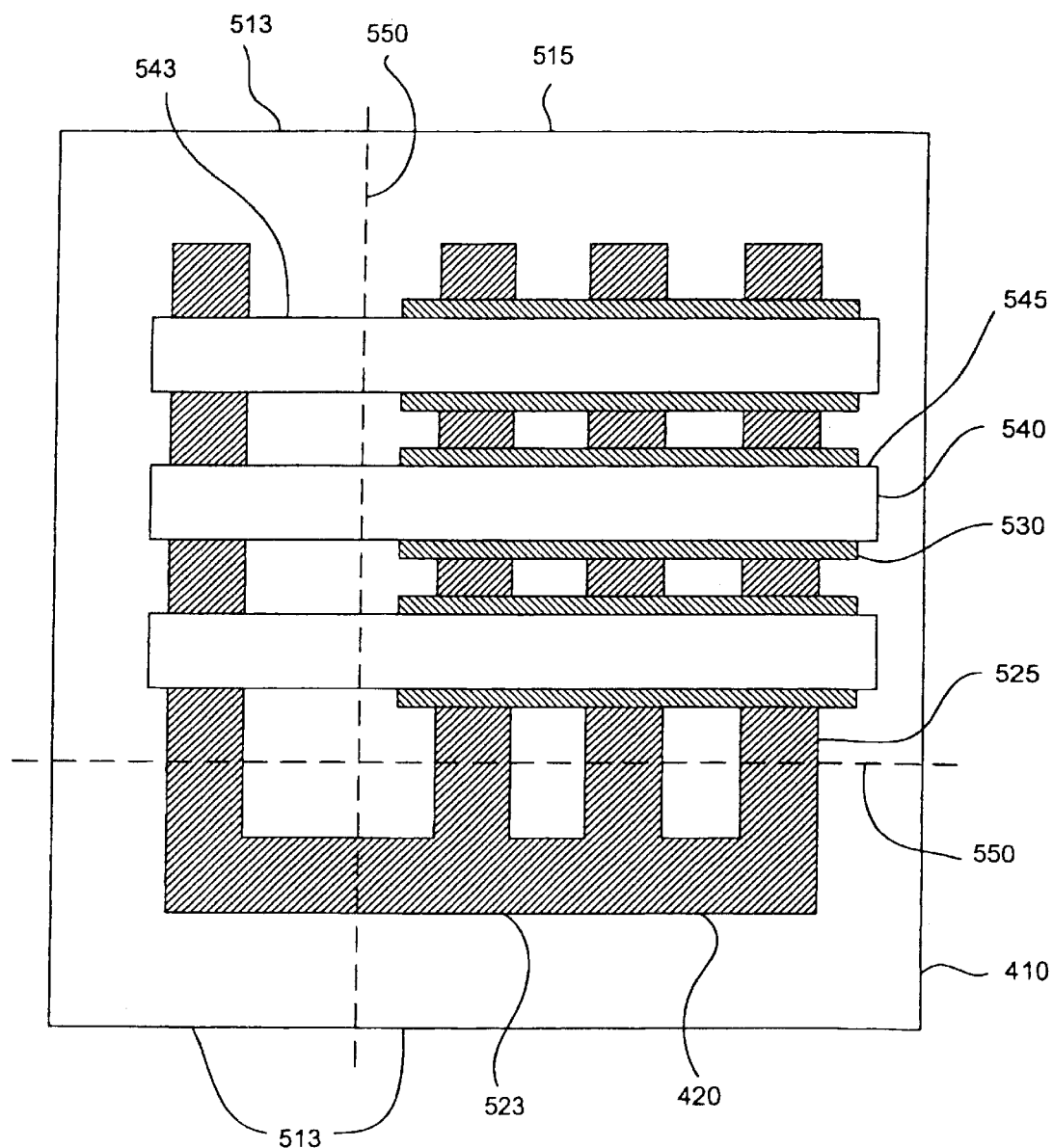
FIG. 5 shows a top view of a passive matrix display using first patterned conductive layer of FIG. 4.

FIG. 5 shows a passive matrix display using first patterned conductive layer 420 of FIG. 4, which is disposed over substrate 410. First patterned conductive layer 420 includes three first electrodes 525, as well as residual portions 523. Scribe lines 550 define the boundary between first electrodes 525 and residual portions 523. An organic layer 530 is disposed over first electrode 525. A second patterned conductive layer 540 is disposed over organic layer 530. Second patterned conductive layer 540 includes three second electrodes 545, as well as residual portions 543. Scribe lines 550 define the boundary between second electrodes 545 and residual portions 543. Scribe lines 550 also define the boundary between a portion 515 of substrate 410, and residual portions 513 of substrate 410.

Organic layer 530 may comprise any suitable organic layer. Organic layer 530 may also comprise multiple organic layers, such as the multiple layers of a double heterostructure or single heterostructure OLED. Organic layer 530 may be the operative layer of any organic optoelectronic device, including an OLED, a photovoltaic cell, a photodetector, a phototransistor, etc.

Although organic layer 530 is shown as patterned into strips parallel to second electrode 540, other configurations may be used. For example, organic layer 530 may be a blanket layer, or organic layer 530 may be patterned into strips parallel to first electrode 420, or other configurations may be used.

The array of FIG. 5 may be fabricated as follows. A substrate 410 having thereon a first patterned conductive layer 420 is obtained or fabricated using any suitable technique, including techniques known to the art. Organic layer 530 is fabricated over first patterned conductive layer 420 using any suitable technique, including techniques known to the art. Second patterned conductive layer 540 is fabricated over organic layer 530 using any suitable technique, including techniques known to the art, such that there is electrical contact between first patterned conductive layer 420 and second patterned conductive layer 540 over residual portions 513 of substrate 410 during at least a portion of the step of depositing second patterned conductive layer 540. The electrical connection between first electrode 525 and second electrode 545 is then broken, for example by scribing and breaking substrate 410 along scribe lines 550, such that residual portions 513 are removed along with any layers deposited thereon.

The electrical contact between first patterned conductive layer 420 and second patterned conductive layer 540 advantageously reduces "charging damage" during the deposition of second patterned conductive layer 540 that might otherwise occur. The terminology "during at least a portion" is used to indicate that electrical contact may not yet be formed at the very beginning of the step. For example, if second patterned conductive layer is a single layer of ITO, the very first particles deposited may not be in electrical contact with each other, let alone first patterned conductive layer 420. However, at some point, second patterned conductive layer 540 becomes sufficiently contiguous that is may be considered in electrical contact with first patterned conductive layer 420. Preferably, second patterned layer 540 is in electrical contact with first patterned conductive layer 420 substantially throughout the deposition process.

In a preferred embodiment, second patterned conductive layer 540, and second electrode 545, are multi-layer structures that include a layer of metal deposited over organic layer 530, and a layer of ITO deposited over the layer of metal. Using conventional fabrication techniques, it is believed that most charging damage occurs during the deposition of ITO, which is generally deposited using a technique such as sputtering that involves secondary electrons. In this preferred embodiment, second patterned conductive layer 540 is in electrical contact with first patterned conductive layer 420 via the layer of metal during the entire deposition of the ITO. The layer of metal may be deposited using techniques such as subliminal evaporation that do not tend to cause charging damage.

In a preferred embodiment, the multilayer top electrode of FIG. 1, 2 or 3 is used as top electrode 540 of FIG. 5.

The electrical contact between first patterned conductive layer 420 and second patterned conductive layer 540 during at least a portion of the step of fabricating second patterned conductive layer 540 may be achieved in a number of different ways. One is by direct physical contact between the two layers, as illustrated in FIG. 5.

Another is by contact through a conductive medium, such as a conductive paste or tape present on residual portions 513 of substrate 410. In this alternative, the parts of patterned conductive layers 420 and 540 extending onto residual portions 513 of substrate 410, i.e., residual portions 523 and 543, may be much smaller than depicted in FIG. 5. Any other suitable means of achieving this electrical contact may also be used.

The breaking of electrical contact between first electrode 525 and second electrode 545 may also be achieved in a number of ways. One is by scribing and breaking substrate 410 along scribe lines 550, as illustrated in FIG. 5.

Another way of breaking the electrical contact between first electrodes 525 and second electrodes 545 is through a subtractive etching process, during which the region of substrate 410 occupied by first electrodes 525 and second electrodes 545 is protected by a mask or a passivation layer selectively deposited prior to the subtractive etching process. Suitable subtractive processes include reactive ion etching and oxygen plasma etching.

Another way of breaking the electrical contact between first electrodes 525 and second electrode 545 is lift-off. In particular, a photoresist or other material that may be readily and selectively removed may be deposited onto residual portions 513 of substrate 410 prior to the fabrication of first electrodes 525. After second electrodes 545 have been fabricated, the photoresist may be removed, along with any layers deposited thereon, breaking the electrical contact.

Another way of breaking the electrical contact between first electrodes 525 and second electrodes 545 is by using a conductive paste, tape or film to achieve the contact, and then removing the conductive paste, tape or film by wiping, peeling, or a similar method. Any other suitable method of breaking the electrical contact may be used, in addition to those specifically described herein.

Figure 6:
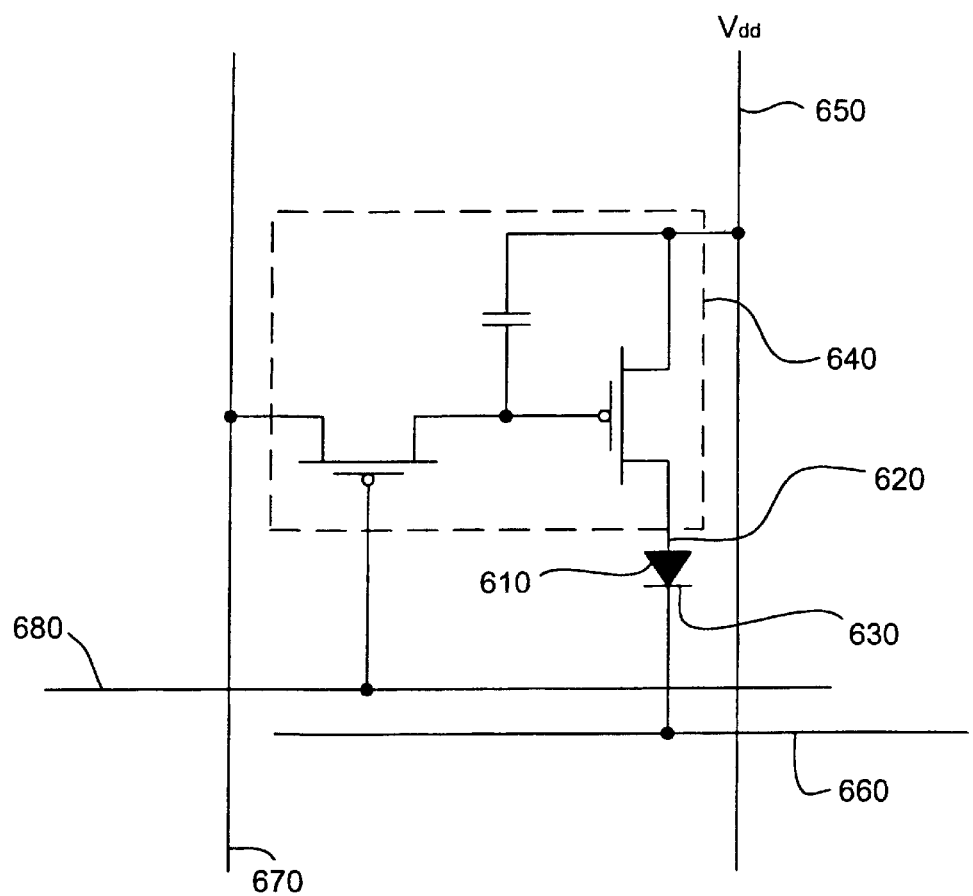
FIG. 6 shows a circuit diagram of a single pixel of an active matrix OLED display

FIG. 6 shows a circuit diagram of a single pixel of an active matrix OLED display. Organic light emitting device 610 has an anode 620 and a cathode 630. Power is provided though power line 650 (Vdd). Cathode 630 is connected to ground, or a fixed reference voltage, though line 660. The voltage at anode 620 is determined by control circuitry 640 based on input from data lines 670 and 680. Control circuitry 640 may include various configurations for controlling a pixel, including those known to the art, and is not limited to the specific circuit illustrated in FIG. 6. For example, two transistors in series may be disposed between power line Vdd and anode 620.

Figure 7:
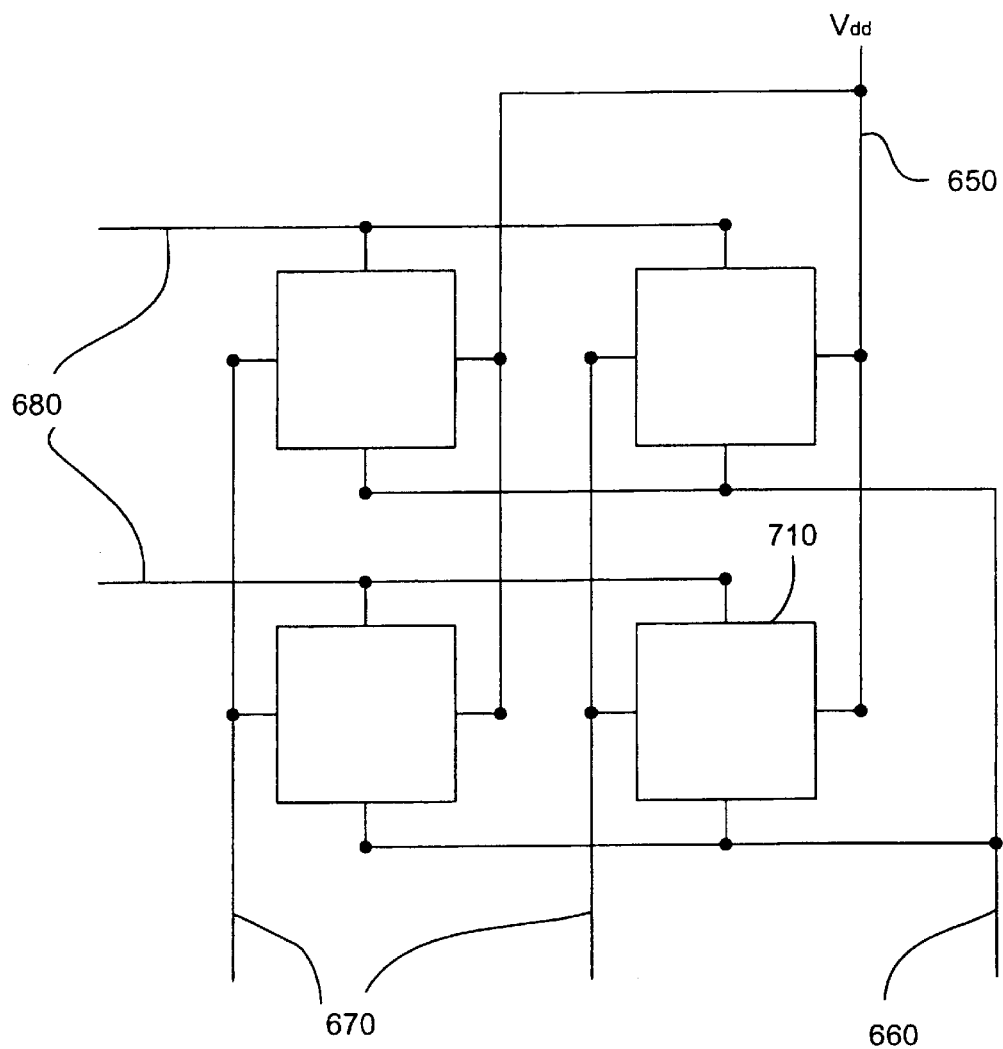
FIG. 7 shows a circuit diagram of 2×2 active matrix OLED array.

FIG. 7 shows a circuit diagram of 2×2 active matrix OLED array. Each pixel 710 of the array may further include the circuit diagram of FIG. 6.

Figure 8:
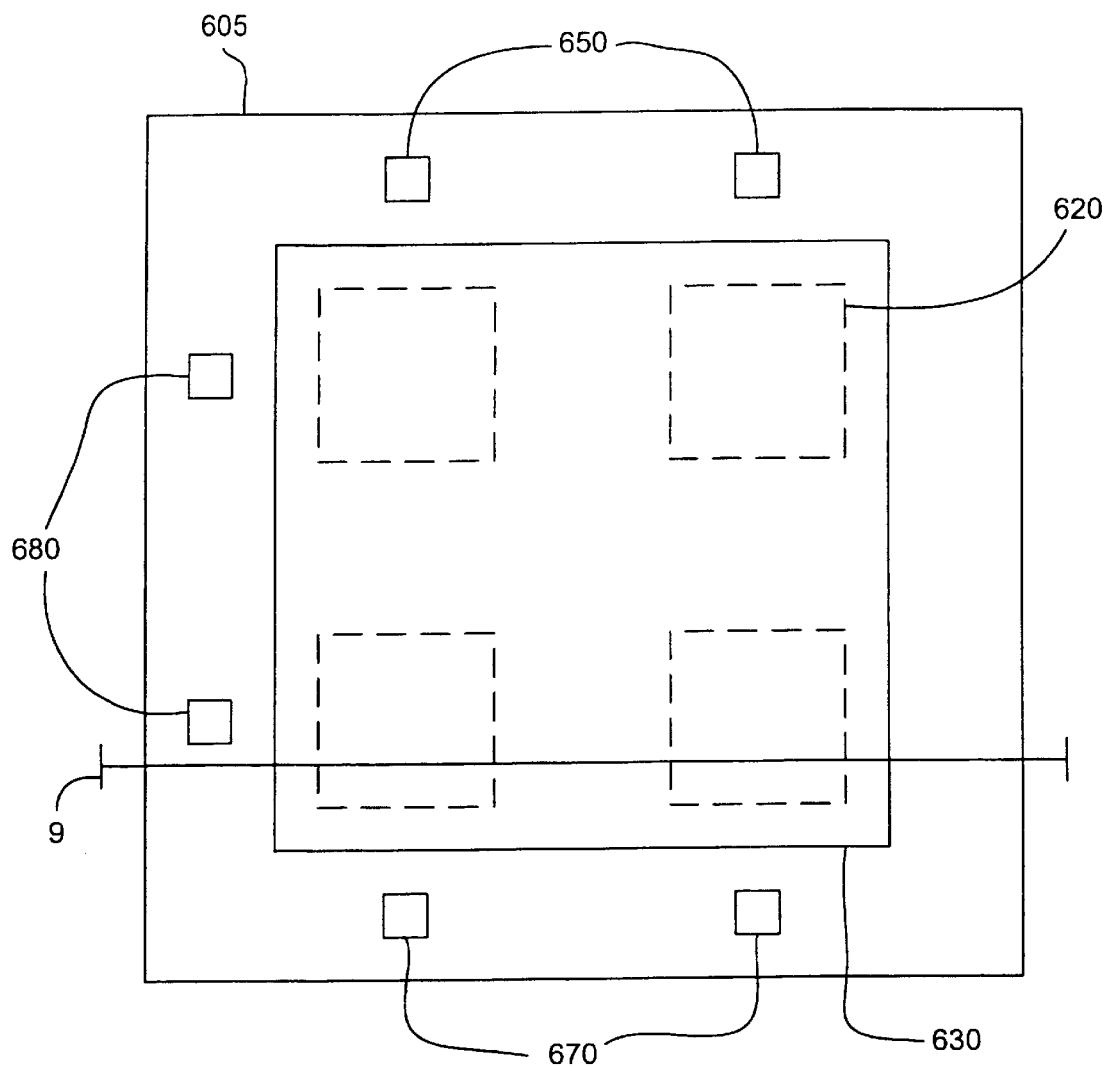
FIG. 8 shows a top schematic view of the array of FIG. 7.
Figure 9:
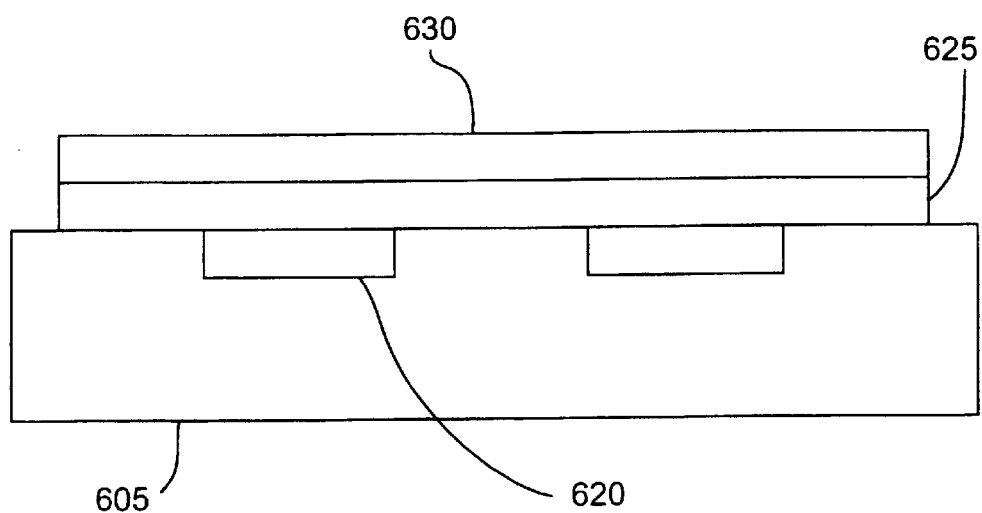
FIG. 9 shows a cross section of FIG. 8 across line 9.

FIG. 8 shows a top schematic view of the array of FIG. 7. FIG. 9 shows a cross section of FIG. 8 across line 9. The array is fabricated on a substrate 605. Control circuitry 640 (not shown) may be on substrate 605. Preferably, substrate 605 may be made of a material similar to those described for substrate 110 of FIG. 1. Anode 620 is disposed over substrate 605, and may be on substrate 605, with an exposed surface, as illustrated. An organic layer 625 (only shown in FIG. 9, not shown in FIG. 8) is disposed over anode 620. Cathode 630, a large conductive sheet spanning the entire array, is disposed over organic layer 605. The voltage at each anode 610 may be individually controlled by signals applied through data lines 670 and 680 (not shown in FIGS. 8 and 9). Power line 650 and data lines 670 and 680 may be on substrate 605, with exposed contacts as illustrated in FIG. 8.

The embodiment of FIGS. 6 through 9 may be fabricated as follows. Substrate 605, control circuitry 640, power lines 650, data lines 670 and 680, and anodes 620 may be fabricated using any suitable technique, including techniques known to the art. Organic layer 625 is then deposited over anodes 620. Cathode 630 is then deposited over organic layer 625, such that cathode 630 is in electrical contact with power lines 650 during at least a portion of the step of depositing cathode 630. This electrical contact is preferably implemented by electrically connecting cathode 630 to the exposed contact of power lines 650 as illustrated in FIG. 9. Any of the techniques described with respect to the embodiment of FIGS. 4 and 5 may be used to achieve this electrical contact. Although power line 650 is not necessarily in direct electrical contact with anodes 610 during the deposition of cathode 630, control circuitry 640 should allow sufficient leakage, such that the field strength between anode 620 and cathode 630 should not exceed about $10^6$ V/cm, corresponding to a voltage of about 10 V across a 1000 Å thick device, during the deposition of cathode 630 using most conventional deposition methods for conductive oxide materials.

This leakage may be obtained in several ways. The characteristics of the transistors, generally thin film transistors, may such that the leakage occurs. For example, for an average pixel size, the capacitance is less than about 10pF. A field of $10^6$ V/cm corresponds to about 10 V across a 1000 Å device. A rough estimate of sufficient leakage is that the voltage discharges in about 1 second, which is much less than an expected deposition time of about 100 seconds. Using the equation $C*V=I*T$, where $C=10^{-11}$, $V=10$, and $T=1$, the result is $I=10^{-10}$ A. If the leakage of the transistors is insufficient, several options exist. First, the transistor controlling the OLED may be designed to increase its leakage, for example by reducing the channel length, or adjusting the threshold voltage to increase leakage when no bias is applied. Although leakage in transistors is generally viewed as undesirable, the reduction in charging damage may justify a higher leakage for this application. Second, an electrical bias may be applied to the control circuitry, for example through data lines 670 and 680, during the deposition of the second conductive layer such that the transistor conducts.

Preferred materials and thicknesses of organic layer 625 and cathode 630 are similar to those for the embodiment of FIGS. 4 and 5.

Preferably, the embodiment of FIGS. 6 through 9 uses as a cathode one of the embodiments described in FIGS. 1 through 5.

It is to be understood that the present invention may be used to fabricate much larger arrays of organic devices than those specifically described herein. For example, although FIG. 5 shows a 3×3 array of devices, and FIG. 7 shows a 2×2 array, much larger arrays may be fabricated.

Although many of the embodiments are not specifically described with respect to multicolor displays, it is understood that all embodiments may be readily adapted for use in a multicolor display by one of ordinary skill in the art. For example, a multi-color display may be fabricated by depositing various down-conversion layers known to the art, or using different organic materials in different devices. A multi-color array may also be fabricated by a number of other methods, such as using an array of white-emitting OLEDs in combination with color filters or a distributed Bragg reflector.

It is also to be understood that the present invention is not limited to the specific illustrated embodiments, and may be used to in a wide variety of other embodiments.

The present invention may be used to fabricate a number of products incorporating organic opto-electronic devices, including flat panel displays, organic photodetectors, organic phototransistors, organic photovoltaic cells, and organic photodiodes, both in arrays and as individual devices.

EXAMPLES

The following structures were fabricated on a 6" OLED deposition tool having an island cluster tool, obtained from the Kurt Lesker company of Pittsburgh, Pa. Each structure was fabricated on a Rel-4-Regular substrate, which is an ITO coated soda lime glass obtained from Applied Films Corp. of Colorado. Prior to fabricating each structure, the substrate was preheated to 100 degrees C. for 2 minutes, and then subjected to an oxygen plasma treatment, 50 W, 100 mTorr for 2 minutes.

Example 1

For comparative purposes, an array of OLEDs similar to the prior art was fabricated by depositing the following layers, in sequence, through appropriate masks. The deposition of all material was by thermal evaporation, except for ITO (which was only deposited in examples 2, 3 and 4), which was deposited by sputtering. Due to the use of different feedback mechanisms to monitor the deposition sources, the source parameter that was controlled may be either a temperature or a voltage. The MgAg layer was co-deposited from separate Mg and Ag targets to the total thickness shown (1000 Å in example 1).

| Material | Dep. Rate (Å/s) | Thickness | Source Temperature (C.) or Power |
|---|---|---|---|
| CuPc | 1.2 | 100 | 345.1 C. |
| NPD | 3 | 500 | 254.4 C. |
| Alq | 3 | 500 | 266.7 C. |
| LiF | 1–2 | 14 | 41.2 V |
| Al | 2 | 10 | 88.9 V |
| CuPc | 2 | 400 | 387.4 C. |
| MgAg | 3 (Mg) | 1000 | 40.5 V |
|  | 1.2 (Ag) | — | 43.5 V |

Although an Ag deposition rate of 1.2 was read on the dial, it is expected that the deposition rate was actually about 0.3 due to a tooling factor in this and in the other examples.

Example 2

An array of OLEDs similar to the device shown in FIG. 1 was fabricated by depositing the following layers, in sequence. The equipment and masks used were the same as for example 1:

| Material | Dep. Rate (Å/s) | Thickness | Source Temperature (C.)/Power |
|---|---|---|---|
| CuPc | 1.2 | 100 | 345.1 C. |
| NPD | 3 | 500 | 257–258 C. |
| Alq | 3 | 500 | 304–331 C. |

-continued

| Material | Dep. Rate (Å/s) | Thickness | Source Temperature (C.)/Power |
|---|---|---|---|
| LiF | 1–2 | 14 | 40.9–41.4 V |
| Al | 2 | 10 | 88.9 V |
| CuPc | 2 | 400 | 347–396 C. |
| MgAg | 3 (Mg) | 100 | 41.5 V |
|  | 1.2 (Ag) | — | 43.5 V |

A layer of ITO was then deposited by sputtering. The chamber contained 3 mTorr of an Ar/$O_2$ mixture, and the power applied to the chamber was about 250 W. The power applied to the target was about 1.25–1.26 A at 1.98.6–197 V. The substrate was passed over the target 3 times at a speed of 17 inches per minute. With these parameters, it is expected that the thickness of ITO deposited was about 500 Å.

Example 3

An array of OLEDs similar to the device shown in FIG. 3 was fabricated by depositing the following layers, in sequence. The equipment and masks used were the same as for example 1:

| Material | Dep. Rate (Å/s) | Thickness | Source Temperature (C.)/Power |
|---|---|---|---|
| CuPc | 1.2 | 100 | 345.1 C. |
| NPD | 3 | 500 | 249 C. |
| Alq | 3 | 500 | 263 C. |
| LiF | 1–2 | 14 | 40.0–40.7 V |
| Al | 2 | 10 | 88.9 V |
| CuPc | 2 | 400 | 348 C. |

A layer of ITO about 500 Å thick was deposited by sputtering using parameters similar to those given for example 2, and the power applied to the target was 1.26 A at 198.3–197.5 V.

Example 4

For comparative purposes, an array of OLEDs was fabricated by depositing the following layers, in sequence. The equipment and masks used were the same as for example 1:

| Material | Dep. Rate (Å/s) | Thickness | Source Temperature (C.)/Power |
|---|---|---|---|
| CuPc | 1.2 | 100 | 336.2 C. |
| NPD | 3 | 500 | 257.4 C. |
| Alq | 3 | 500 | 257.8 C. |
| MgAg | 3 (Mg) | 100 | 38.8 V |
|  | 1.2 (Ag) | — | 43.7 V |

A layer of ITO about 500 Å thick was deposited by sputtering using parameters similar to those given for example 2, and the power applied to the target was 1.26 A at 197.1–197.2 V.

Figure 10:
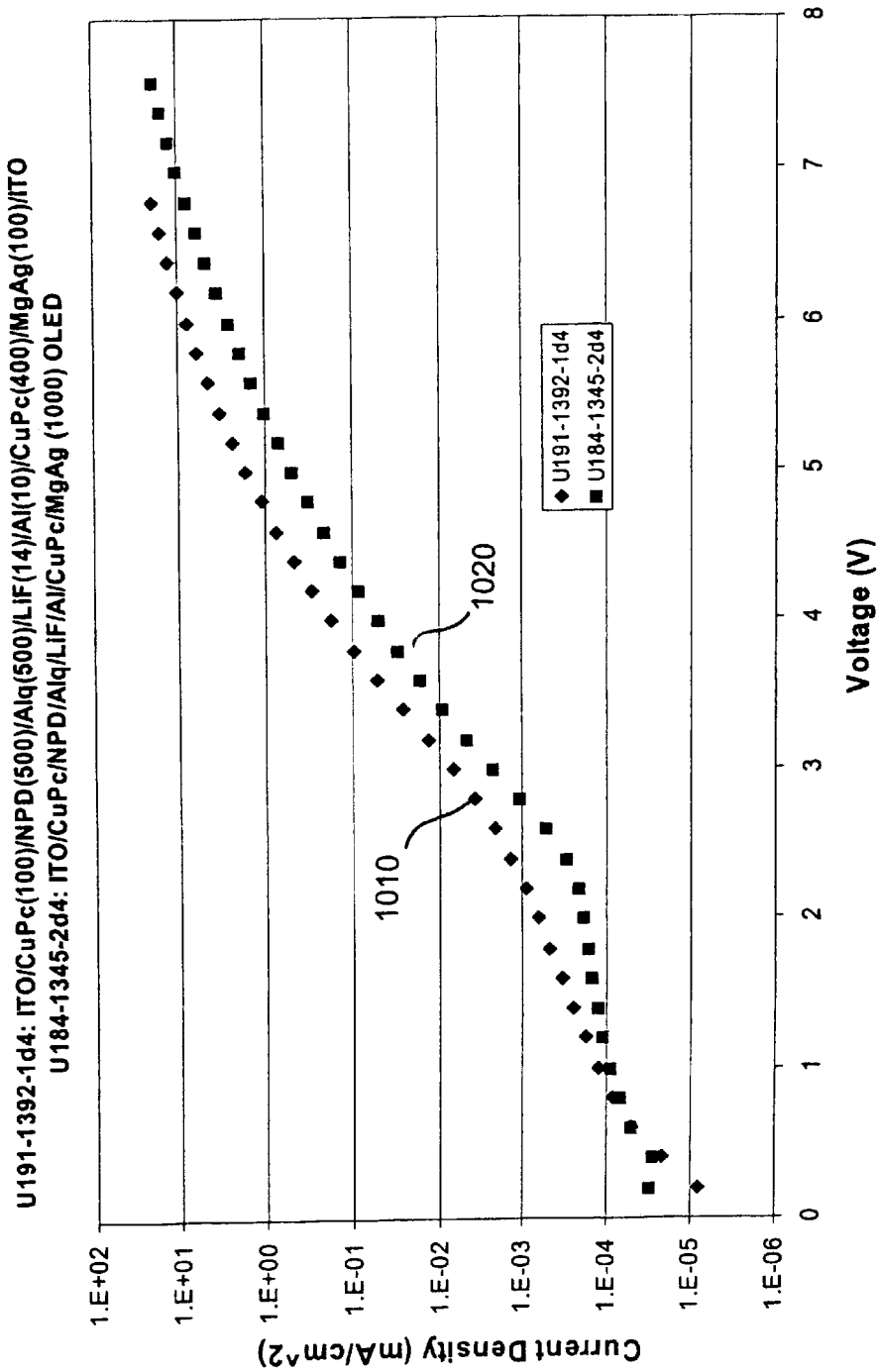
FIG. 10 shows a plot of current density v. voltage for two of the example devices.

FIG. 10 shows a plot of current density v. voltage for two of the example devices. Plot 1010, illustrated by diamonds, shows the current density v. voltage for a device fabricated as described in example 2. Plot 1020, illustrated by squares, shows the current density v. voltage for a device fabricated as described in example 1. The plots show that the device of example 2 has a significantly higher current density than the device of example 1.

Without intending to be limited as to any theory as to how the invention works, it is believed that the ITO deposition process may knock some Mg from the previously deposited Mg:Ag layer into the CuPc layer, thereby improving electron injection and lowering the operating voltage.

Figure 11:
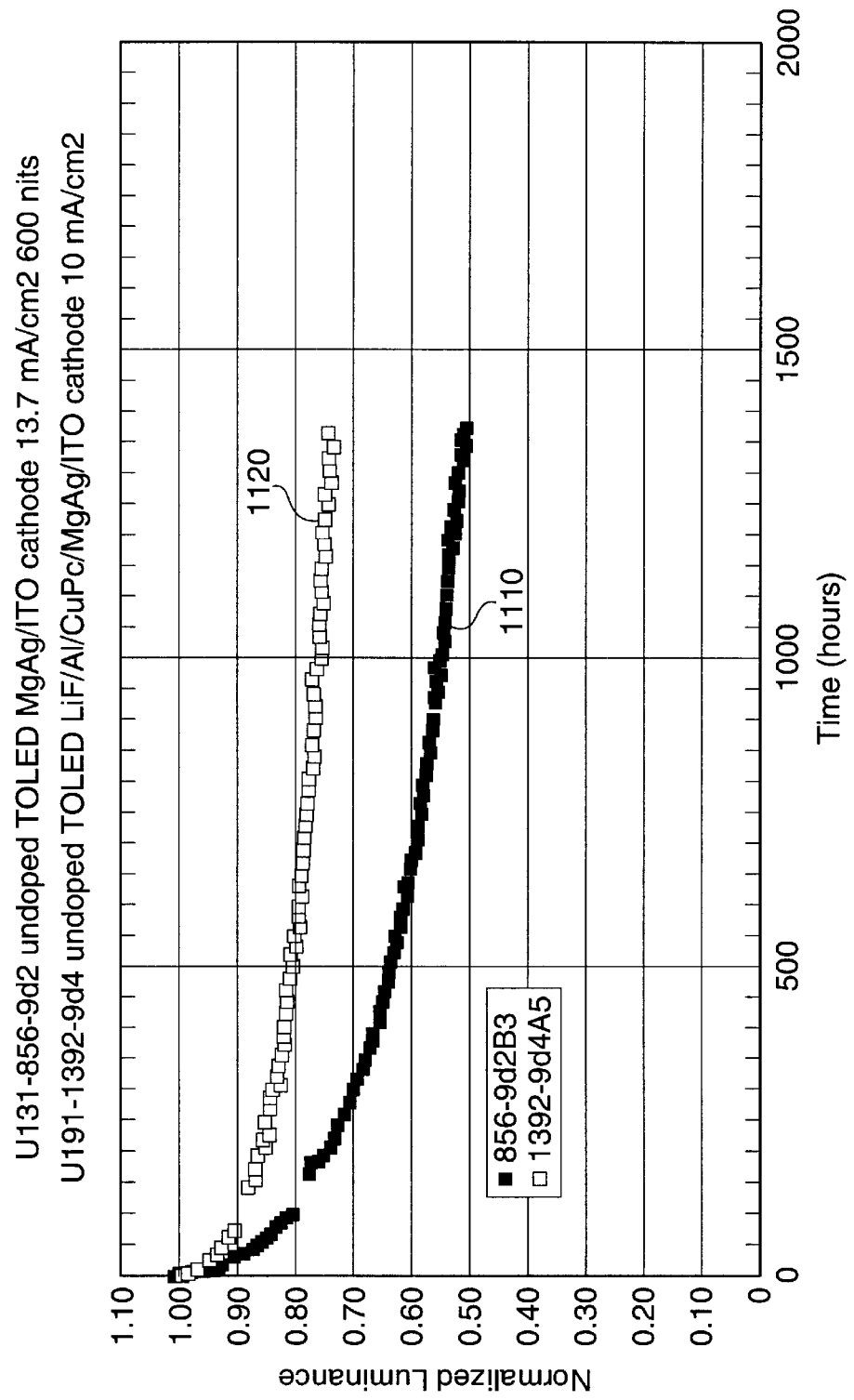
FIG. 11 shows normalized luminescence v. time for these devices.

Lifetime tests were performed on devices fabricated per examples 2 and 4. The devices were run with a constant current of 10 mA/cm2 for about 1400 hours. FIG. 11 shows normalized luminescence v. time for these devices. Plot 1110 shows the normalized luminescence v. time for a device fabricated according to example 4, illustrated by dark squares. Plot 1120 shows the normalized luminescence v. time for a device fabricated according to example 2, illustrated by triangles. The plots show that the device of example 2 retains its ability over time to luminesce much better than the device of example 4.

Without intending to be limited to any theory as to why the invention works, it is believed that the improved electron injection of the devices of Example 2 leads to a better balance of carriers in the OLED, which improves the OLED lifetime.

While the present invention is described with respect to particular examples and preferred embodiments, it is understood that the present invention is not limited to these examples and embodiments. In particular, the present invention is not limited to OLEDs, and may be applied to a wide variety of opto-electronic devices. The present invention as claimed therefore includes variations from the particular examples and preferred embodiments described herein, as will be apparent to one of skill in the art.

What is claimed is:

1. A method of fabricating a device, comprising the steps of:
   (a) obtaining first conductive layer disposed over a substrate;
   (b) fabricating an organic layer over the first conductive layer;
   (c) fabricating a second conductive layer over the organic layer such that the second conductive layer is in electrical contact with the first conductive layer during at least a portion of the step of fabricating the second conductive layer;
   (d) breaking the electrical contact between the first conductive layer and the second conductive layer.

2. The method of claim 1, wherein the device is an organic light emitting device.

3. The method of claim 1, wherein the step of fabricating a second conductive layer includes the deposition of a layer of metal, followed by the deposition of a layer of a conductive oxide.

4. The method of claim 3, wherein the conductive oxide is indium tin oxide.

5. The method of claim 3, wherein the conductive oxide is zinc indium tin oxide.

6. The method of claim 3, wherein the conductive oxide is aluminum zinc oxide.

7. The method of claim 3, wherein the second conductive layer is in electrical contact with the first conductive layer during the entire deposition of the layer of conductive oxide in the second conductive layer.

8. The method of claim 1, wherein the second conductive layer is a metal layer.

9. The method of claim 1, wherein the second conductive layer is in electrical contact with the first conductive layer in step (c) because the second conductive layer is in physical contact with the first conductive layer.

10. The method of claim 1, wherein the second conductive layer is in electrical contact with the first conductive layer in step (c) because both the first and second conductive layers are electrically connected to a conductive medium.

11. The method of claim 10, wherein the conductive medium is a conductive paste.

12. The method of claim 10, wherein the conductive medium is a conductive tape.

13. The method of claim 1, wherein at least one of the conductive layers is transparent.

14. The method of claim 1, wherein the electrical connection is broken in step (d) by scribing and breaking the substrate.

15. The method of claim 1, wherein the electrical connection is broken in step (d) by a subtractive etching process.

16. The method of claim 1, wherein the electrical connection is broken in step (d) by lift-off.

17. The method of claim 11, wherein the electrical connection is broken in step (d) by wiping the conductive paste.

18. The method of claim 12, wherein the electrical connection is broken in step (d) by peeling the conductive tape.

19. The method of claim 1, wherein the second electrode is fabricated with a process that generates secondary electrons.

20. The method of claim 1, wherein the device is an organic photovoltaic cell.

21. The method of claim 1, wherein the device is an organic light emitting device.

22. The method of claim 1, wherein the device is an organic phototransistor.

23. The method of claim 1, wherein the device is an organic photodetector.

24. A method of fabricating a device, comprising the steps of:
   (a) obtaining first conductive layer disposed over a substrate;
   (b) fabricating an organic layer over the first conductive layer;
   (c) fabricating a metal layer over the organic layer, such that the metal layer is in electrical contact with the first conductive layer after the metal layer has been fabricated;
   (d) fabricating a transparent conductive oxide layer over the metal layer;
   (e) breaking the electrical contact between the first conductive layer and the metal layer.

25. A method of fabricating a device, comprising the steps of:
   (a) obtaining first conductive layer disposed over a substrate;
   (b) fabricating an organic layer over the first conductive layer;
   (c) fabricating a second conductive layer over the organic layer such that the second conductive layer is in electrical contact with ground during at least a portion of the step of fabricating the second conductive layer;
   (d) breaking the electrical contact between the second conductive layer and ground.

26. A method of fabricating an active matrix array of organic opto-electronic devices, comprising the steps of:
   (a) obtaining a substrate having circuitry adapted to control the current flowing through each device, and having a first conductive layer disposed thereon, the first conductive layer being electrically attached to the circuitry, (b) fabricating an organic layer over the first conductive layer;
(c) fabricating a second conductive layer over the organic layer such that the second conductive layer is in electrical contact with the circuitry, and such that the circuitry allows sufficient leakage between the first conductive layer and the second conductive layer to reduce the electrical field across the organic layer, during at least a portion of the step of fabricating the second conductive layer;
(d) breaking the electrical contact between the circuitry and the second conductive layer.

27. The method of claim 26, wherein the electrical field across the organic layer does not exceed about $10^6$ V/cm during step (c).

28. The method of claim 1, wherein the step of fabricating a second conductive layer includes the deposition of a layer of metal, followed by the deposition of a layer of a conductive oxide.

29. The method of claim 28, wherein the electrical field across the organic layer does not exceed about $10^6$ V/cm during the deposition of conductive oxide.

30. The method of claim 26, wherein the control circuitry is designed to allow sufficient leakage without the application of a bias voltage to the control circuitry.

31. The method of claim 26, wherein a bias voltage is applied to the control circuitry during at least a portion of the deposition of the second conductive layer.

32. The method of claim 26, wherein the array is an array of organic light emitting devices.

33. The method of claim 26, wherein the array is an array of organic photodetectors.

* * * * *

UNITED STATES PATENT AND TRADEMARK OFFICE
CERTIFICATE OF CORRECTION

PATENT NO.   : 6,569,697 B2  
DATED        : May 27, 2003  
INVENTOR(S)  : Lu et al.

It is certified that error appears in the above-identified patent and that said Letters Patent is hereby corrected as shown below:

<u>Column 6,</u>  
Line 32, change "in.that" to -- in that --.

Signed and Sealed this

Eleventh Day of April, 2006

JON W. DUDAS  
*Director of the United States Patent and Trademark Office*